(12) United States Patent
Zhou et al.

(10) Patent No.: US 12,666,545 B2
(45) Date of Patent: Jun. 23, 2026

(54) HIGHLY INTEGRATED POWER ELECTRONICS AND METHODS OF MANUFACTURING THE SAME

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 492 days.

(21) Appl. No.: 18/130,719

(22) Filed: Apr. 4, 2023

(65) Prior Publication Data

US 2024/0341043 A1 Oct. 10, 2024

(51) Int. Cl.
*H05K 3/46* (2006.01)
*B33Y 10/00* (2015.01)
(Continued)

(52) U.S. Cl.
CPC ......... *H05K 3/4611* (2013.01); *H05K 3/0047* (2013.01); *H05K 3/30* (2013.01); *H05K 3/423* (2013.01); *H05K 3/4644* (2013.01); *H05K 3/4697* (2013.01); *H05K 7/20272* (2013.01); *B33Y 10/00* (2014.12); *H05K 2203/107* (2013.01)

(58) Field of Classification Search
CPC ...... H05K 3/4611; H05K 3/0047; H05K 3/30; H05K 3/423; H05K 3/4644; H05K 3/4697; H05K 7/20254; H05K 7/20272; H05K 7/20927; H05K 2203/107; H05K 1/0272; B33Y 10/00
See application file for complete search history.

(56) References Cited

U.S. PATENT DOCUMENTS

| | | | |
|---|---|---|---|
| 11,990,386 B2 * | 5/2024 | Iyengar | H01L 23/42 |
| 2003/0141600 A1 * | 7/2003 | van der Windt | H05K 3/44 |
| | | | 438/668 |

(Continued)

OTHER PUBLICATIONS

Kim et.al., BN-MWCNT/PPS core-shell structured composite for high thermal conductivity with electrical insulating via particle coating, Polymer, vol. 101, Sep. 28, 2016, pp. 168-175. (Year: 2016).*

*Primary Examiner* — Thomas J Hong
*Assistant Examiner* — Jose K Abraham
(74) *Attorney, Agent, or Firm* — Christopher G. Darrow; DARROW MUSTAFA PC

(57) ABSTRACT

A method for high volume manufacture of highly integrated power electronics embedded printed circuit board (PCB)-cold plate assemblies includes bonding a power device fabrication panel to a multi-layer PCB, drilling via passageways in the multi-layer PCB, and electroplating a conductive metal into the vias before bonding the power device fabrication panel to a plurality of cold plates and forming an IPEs embedded PCB-cold plate fabrication panel. The method also includes cutting the IPEs embedded PCB-cold plate fabrication panel into a plurality of highly IPEs embedded PCB-cold plate assemblies.

20 Claims, 10 Drawing Sheets

(51) Int. Cl.
    *H05K 3/00*        (2006.01)
    *H05K 3/30*        (2026.01)
    *H05K 3/42*        (2006.01)
    *H05K 7/20*        (2006.01)

(56)                References Cited

U.S. PATENT DOCUMENTS

| | | | |
|---|---|---|---|
| 2014/0251658 A1* | 9/2014 | Lin | H05K 1/0271 |
| | | | 174/252 |
| 2014/0355218 A1* | 12/2014 | Vinciarelli | H05K 5/065 |
| | | | 361/728 |
| 2018/0042137 A1* | 2/2018 | Reeves | H05K 7/20254 |
| 2020/0185302 A1 | 6/2020 | Lu et al. | |
| 2020/0253060 A1* | 8/2020 | Vinciarelli | H05K 1/11 |
| 2020/0383238 A1* | 12/2020 | Chan | H05K 7/20281 |
| 2021/0175149 A1 | 6/2021 | Gaulin et al. | |
| 2021/0219415 A1* | 7/2021 | Goergen | H05K 7/20509 |
| 2022/0053630 A1* | 2/2022 | Zhou | H05K 1/0207 |
| 2022/0102260 A1 | 3/2022 | Cole et al. | |
| 2022/0141951 A1 | 5/2022 | Zhou et al. | |
| 2022/0157693 A1 | 5/2022 | Zhou et al. | |
| 2023/0230896 A1* | 7/2023 | Kwon | H05K 3/3436 |
| | | | 438/122 |

* cited by examiner

HIGHLY INTEGRATED POWER ELECTRONICS AND METHODS OF MANUFACTURING THE SAME

TECHNICAL FIELD

The present disclosure relates to integrated power electronics, and particularly to printed circuit boards with power devices embedded therein.

BACKGROUND

Printed circuit boards (PCBs) are typically used for mechanical support and electrical connection of electronic components using conductive pathways of copper sheets laminated onto a non-conductive substrate. And multi-layer PCBs provide higher capacity and/or density of electronic components in a smaller footprint by incorporating two or more layers. However, the design and/or manufacture of multilayer PCBs can be difficult.

The present disclosure addresses issues related to the manufacture of multi-layer PCBs and other issues related to multi-layer PCBs.

SUMMARY

This section provides a general summary of the disclosure and is not a comprehensive disclosure of its full scope or all of its features.

In one form of the present disclosure, a method of fabricating a plurality of highly integrated power electronics (IPEs) embedded printed circuit board (PCB)-cold plate assemblies includes bonding a power device fabrication panel to a multi-layer PCB, drilling via passageways in the multi-layer PCB, and electroplating a conductive metal into the vias before bonding the power device fabrication panel to a plurality of cold plates and forming an IPEs embedded PCB-cold plate fabrication panel. The method also includes cutting the IPEs embedded PCB-cold plate fabrication panel into a plurality of highly IPEs embedded PCB-cold plate assemblies.

In another form of the present disclosure, a method of fabricating a plurality of highly IPEs embedded PCB-cold plate assemblies includes laminating a multi-layer PCB onto a power device fabrication panel via a low thermal resistance dielectric layer, drilling via passageways in the multi-layer PCB, electroplating copper into the vias, and bonding the power device fabrication panel to a cold plate fabrication panel and forming an IPEs embedded PCB-cold plate fabrication panel. The method also includes cutting the IPEs embedded PCB-cold plate fabrication panel into a plurality of highly IPEs embedded PCB-cold plate assemblies.

In still another form of the present disclosure, a method of fabricating a plurality of highly IPEs embedded PCB-cold plate assemblies includes laminating a multi-layer PCB onto a power device fabrication panel via a low thermal resistance dielectric layer, drilling via passageways in the multi-layer PCB, electroplating copper into the vias, and bonding a plurality of cold plate substrates directly to a plurality of power devices embedded in the power device fabrication panel. The method also includes bonding a plurality of 3D printed cold plate manifolds to the power device fabrication panel and forming an IPEs embedded PCB-cold plate fabrication panel, and cutting the IPEs embedded PCB-cold plate fabrication panel into a plurality of highly IPEs embedded PCB-cold plate assemblies.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figures 1A, 1B:
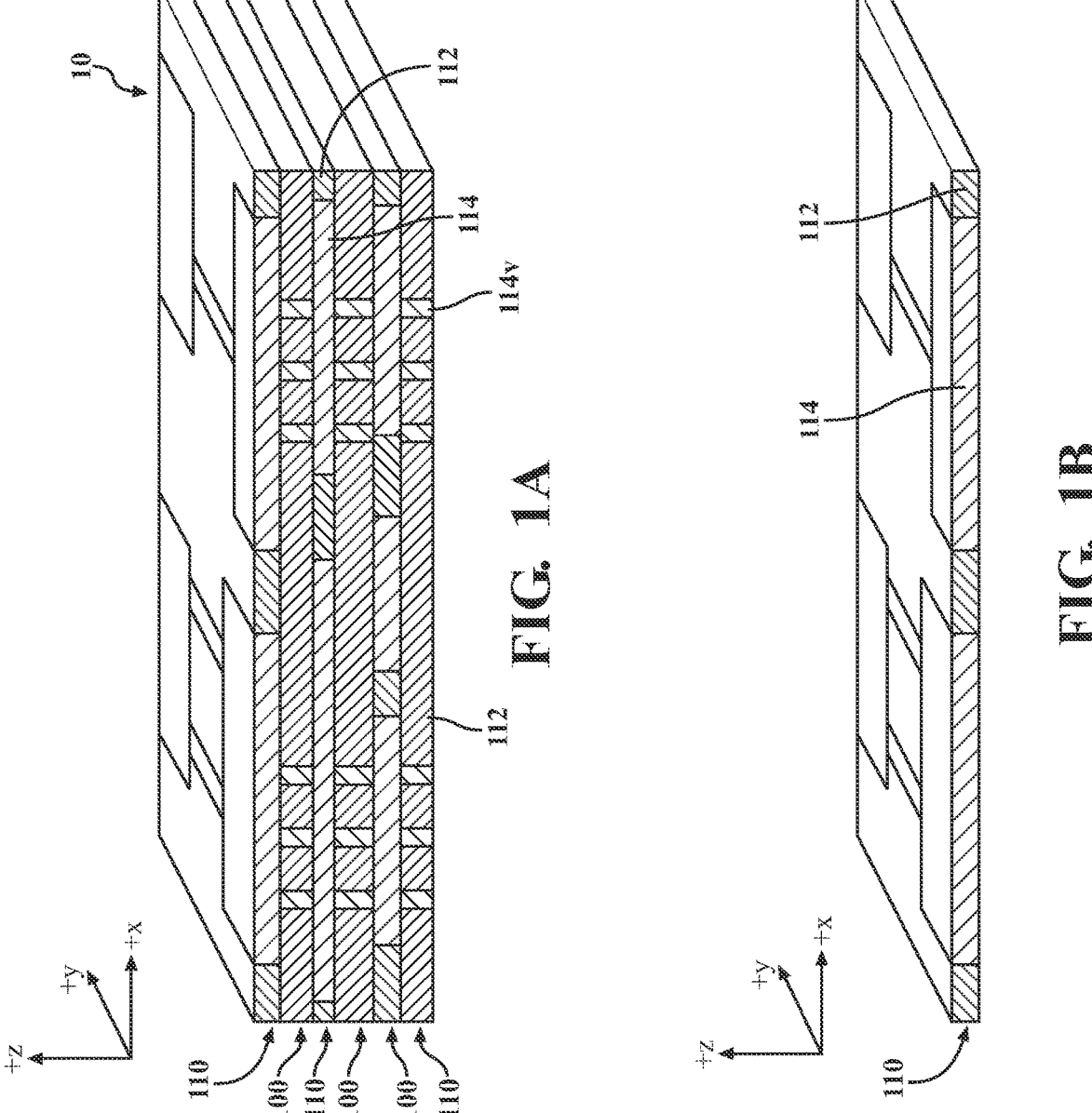
FIG. 1A shows a perspective view of a multi-layer PCB for a highly integrated power electronics embedded PCB-cold plate assembly according to the teachings of the present disclosure.
FIG. 1B shows a perspective for a power layer of the multi-layer PCB in FIG. 1A.

It should be noted that the figures set forth herein are intended to exemplify the general characteristics of the methods, devices, and systems among those of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides highly integrated power electronics embedded PCB-cold plate assemblies and methods for high volume manufacturing highly integrated power electronics (IPEs) embedded PCB-cold plate assemblies. As used herein, the phrase "highly integrated power electronics embedded PCB" refers to a single multi-layer PCB module or unit with two or more power semiconductor devices (also referred to herein simply as "power device" or "power devices"), control/drive/protection electronic circuitry, and passive components, embedded therein. Also, as used herein, the phrase "power device" refers to a semiconductor device used as a switch or rectifier in power electronics and a single multi-layer PCB module or unit with two or more power semiconductor devices embedded at least partially therein is referred to herein as an "integrated power electronics embedded PCB."

The highly IPEs embedded PCB-cold plate assemblies each include a cold plate with an IPEs PCB bonded to and in thermal communication with the cold plate. The cold plate can be fluid cooled, i.e., a cooling fluid can flow through the cold plate, such that temperatures of the one or more power devices during operation remain below a predefined temperature. In addition, the IPEs PCB is electrically isolated from the cold plate via a low thermal resistance (LTR) dielectric layer, a CVD dielectric layer, a ceramic sintered layer, and/or a 3D printed dielectric layer.

The methods for high volume manufacturing the highly IPEs embedded PCB-cold plate assemblies include bonding a multi-layer PCB to a power device fabrication panel, drilling vias into the multi-layer PCB, and electroplating a conductive metal (e.g., copper and alloys thereof) into the vias to form conductive vias in an IPEs embedded PCB fabrication panel. In some variations, the IPEs embedded PCB fabrication panel is bonded to a cold plate fabrication to form an IPEs embedded PCB-cold plate fabrication panel which is then cut into a plurality of individual highly IPEs embedded PCB-cold plate assemblies. As used herein, the phrase "fabrication panel" refers to a panel containing a plurality of components that are used for the manufacture of individual highly IPEs embedded PCB-cold plate assemblies. For example, a power device fabrication panel is a panel containing a plurality of power devices that are used for the manufacture of individual highly IPEs embedded PCBs-cold plate assemblies as disclosed herein, and a cold plate fabrication panel is a panel containing a plurality of cold plates that are used for the manufacture of individual highly IPEs embedded PCBs-cold plate assemblies as disclosed herein.

In other variations, a plurality of cold plate substrates are bonded to an IPEs embedded PCB fabrication panel and cold plate manifolds are also bonded to the IPEs embedded PCB fabrication panel to form an IPEs embedded PCB-cold plate fabrication panel which is cut into a plurality of individual highly IPEs embedded PCB-cold plate assemblies. Accordingly, the methods for high volume manufacturing the highly IPEs embedded PCB-cold plate assemblies according to the present disclosure provide for electroplating an IPEs embedded PCB fabrication panel without a cold plate fabrication panel and/or one or more cold plates coming into contact with or being exposed to a potentially corrosive electroplating solution (e.g., an acid electroplating bath).

Referring now to FIGS. 1A-1B, a perspective cross-sectional view of a multi-layer PCB 10 is shown in FIG. 1A and an isolated perspective cross-sectional view of a power layer 110 of the multi-layer PCB 10 is shown in FIG. 1B. The multi-layer PCB 10 includes a plurality of dielectric layers 100 and a plurality of the power layers 110. The power layers 110 include a dielectric material 112 and a conductive material 114. The dielectric layers 100 include the dielectric material 112 and conductive vias 114v that provide electrical communication or pathways between adjacent power layers 110. Stated differently, the power layers 110 include conductive (e.g., copper) patterns and the dielectric layers 100 include conductive (e.g., copper) pathways that connect the conductive material 114 such that the multi-layer PCB 10 functions and/or operates as desired.

In some variations, the power layers 110 are formed from a glass reinforced epoxy laminate dielectric material (e.g., FR-4), or other dielectric material, with the conductive material 114 embedded therein. In other variations, the power layers 110 are 3D printed using a dielectric material ink to form the dielectric material 112, with the conductive material 114 embedded therein. And in at least one variation, the conductive material 114 is also 3D printed with a conductive material ink. Non limiting examples of dielectric material inks are inks that include UV-curable dielectric materials such as UV-curable acrylated monomer selected from one or more of an acrylate epoxy, an acrylate polyester, an acrylate urethane, and an acrylate silicone, among others. And non-limiting examples of conductive material inks are inks that include silver nanoparticles and/or graphene nanosheets, among others. It should be understood that the dielectric layers 100 can also be formed from a glass reinforced epoxy laminate dielectric material (e.g., FR-4), or other dielectric material, or 3D printed using a dielectric material ink.

The dielectric layers 100 and the power layers 110 have a predefined average thickness (z-direction). For example, in some variations, the predefined average thickness is between about 50 micrometers (μm) and about 250 μm, for example, between about 75 μm and about 200 μm. And in at least one variation, the predefined thickness is between about 75 μm and about 150 μm, for example, between about 80 μm and about 120 μm.

Figure 2:
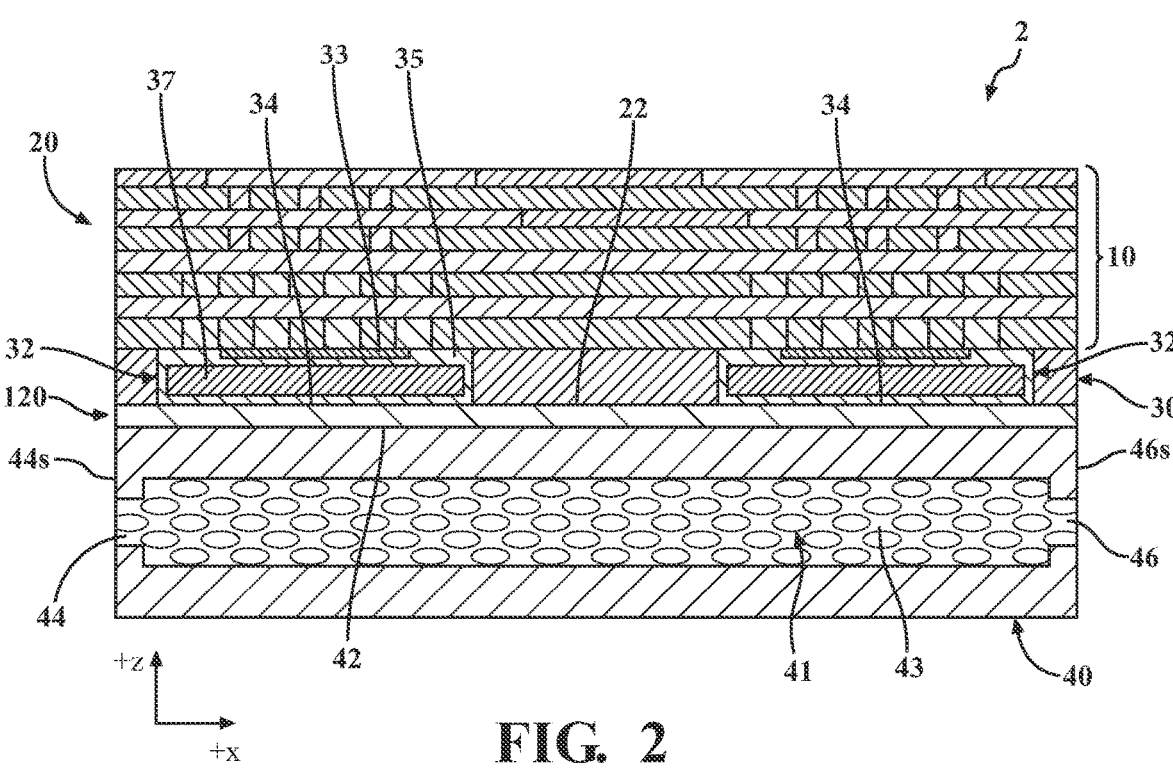
FIG. 2 shows a side cross-sectional view of a highly integrated power electronics embedded PCB-cold plate assembly according to the teachings of the present disclosure.

Referring to FIG. 2, a side cross-sectional view of a highly IPEs embedded PCB-cold plate assembly 2 according to one form of the present disclosure is shown. The highly IPEs embedded PCB-cold plate assembly 2 includes a power electronics embedded PCB 20 formed from the multi-layer PCB 10 bonded to a power device layer 30 (also referred to herein as "power device unit") with one or more power device-substrate assemblies 32 embedded therein, and a cold plate 40. As used herein, the phrase "power device-substrate assembly" refers to a power device 33 (e.g., a MOSFET power device) attached or bonded to a substrate 35. In some variations, the substrate 35 is a copper-graphite substrate 35 with a graphite core 37 embedded within a shell of copper. And in such variations, the power device is bonded to the copper shell, e.g., via silver sintering.

In some variations, the power device-substrate assemblies 32 are totally embedded in the multi-layer PCB 10 (not shown), i.e., one or more dielectric layers 100 and/or one or more power layers 110 are above (+z direction) the power device-substrate assemblies 32, and one or more dielectric layers 100 and/or one or more power layers 110 are below (−z direction) the power device-substrate assemblies 32. In other variations, and as illustrated in FIG. 2, the power device-substrate assemblies 32 form at least a portion of a lower surface 22 of the power electronics embedded PCB 20. That is, a lower surface 34 of one or more power device-substrate assemblies 32 is aligned or coplanar with the lower surface 22 of the power electronics embedded PCB 20 such that the lower surfaces 22, 34 of the power electronics embedded PCB 20 and the power device-substrate assembly(ies), respectively, are bonded to the cold plate via a bonding interface 120. As used herein, the phrase "bonding interface" refers to one or more layers disposed between a multi-layer PCB bonded to a cold plate and/or a power electronics embedded PCB bonded to a cold plate.

The power electronics embedded PCB 20 is bonded to the cold plate 40 such that the power device-substrate assemblies 32 are in thermal communication with the cold plate 40. Accordingly, and during operation of the highly integrated power electronics embedded PCB-cold plate assembly 2, the power device-substrate assemblies 32 are cooled via the flow of heat from the power device-substrate assemblies 32 to the cold plate 40. In some variations, the cold plate 40 includes an internal fluid chamber 41 with an inlet 44 and an outlet 46 extending through sidewalls 44s, 46s, respectively. In some variations, fins, porous material, mesh-structured, machined and/or cast heat sinks 43 are disposed within the fluid chamber 41. In at least one variation, an inlet tube (not shown) is attached to and in fluid communication with the inlet 44 and/or an outlet tube (not shown) is attached to and in fluid communication with the outlet 46. Also, in some variations the cold plate 40 is formed form an electrically conductive material (e.g., aluminum) and it is desirable that a bonding interface 120 between the power electronics embedded PCB 20 and the cold plate 40 exhibit desired electrical insulation and thermal conduction properties.

Still referring to FIG. 2, the bonding interface 120 is disposed between the cold plate 40 and the power electronics embedded PCB 20. In some variations, the bonding interface 120 includes a LTR dielectric layer disposed between the power electronics embedded PCB 20 bonded to the cold plate 40. In other variations, the bonding interface 120 includes a CVD dielectric layer disposed between the power electronics embedded PCB 20 bonded to the cold plate 40. In still other variations, the bonding interface 120 includes a ceramic sintered layer disposed between the power electronics embedded PCB 20 bonded to the cold plate 40. In other variations, the bonding interface 120 includes solder layer, solder-AlN-solder layers, and/or solder-$Si_3N_4$-solder layers. And in at least one variation the bonding interface 120 is one or more 3D printed dielectric layers disposed between the power electronics embedded PCB 20 bonded to the cold plate 40, e.g., one or more polymer-conductive filler composite layers. As used herein, the phrase "CVD dielectric layer" refers to a dielectric layer that has been formed on a surface using chemical vapor deposition (CVD).

In some variations, the bonding interface 120 is disposed between an upper (+z direction) surface 42 of the cold plate 40 and a lower (−z direction) surface 22 of the power electronics embedded PCB 20 and/or a lower surface 34 of one or more power device-substrate assemblies 32. For example, in some variations, the bonding interface 120 is bonded directly to the upper surface 42 of the cold plate 40, i.e., the bonding interface 120 is in direct contact with the upper surface 42. In at least one variation, the bonding interface 120 is bonded directly to the lower surface 22 and/or the lower surface 34 of one or more power device-substrate assemblies 32 of the power electronics embedded PCB 20. And in some variations, the bonding interface 120 is bonded directly to the upper surface 42 of the cold plate 40 and the lower surface 22 of the power electronics embedded PCB 20, which may or may not include a lower surface 34 or one or more power device-substrate assemblies 32. As used herein, the phrase "directly bonded" refers to one component or layer being bonded to and in direct contact with another component or layer, i.e., without any additional components or layers therebetween.

In variations where the bonding interface 120 is a LTR dielectric layer, the LTR dielectric layer can be formed from any dielectric material and/or dielectric composite material suitable to electrically isolate the power electronics embedded PCB 20 from the cold plate 40. In some variations, the LTR dielectric layer is a ceramic-polymer composite dielectric material such as $BaTiO_3$-polymer dielectric materials, $Pb(Zr_xTi_{1-x})O_3$-polymer dielectric materials ($0 \leq x \leq 1$), and/or $SrTiO_3$ dielectric materials, among others. Also, in some variations, the LTR dielectric layers according to the teachings of the present disclosure have an average thickness (z direction) less than about 250 μm, for example less than about 200 μm, less than about 150 μm, less than about 100 μm, less than about 50 μm, less than about 40 μm, less than about 30 μm, less than about 20 μm, or less than about 10 μm. In some variations the LTR dielectric layer has an average thickness between about 10 μm and about 50 μm, for example between about 20 μm and about 40 μm, or between about 25 μm and about 35 μm.

In variations where the bonding interface 120 is CVD dielectric layer, the CVD dielectric layer can be formed or deposited directly on the upper surface 42 of the cold plate 40, and the bonding interface 120 can include a bonding layer in direct contact with and sandwiched between CVD dielectric layer and the lower surface 22 and/or the lower surface 34 of one or more power device-substrate assemblies 32 of the power electronics embedded PCB 20. In other variations, the CVD dielectric layer can be formed or deposited directly on the lower surface 22 and/or the lower surface 34 of one or more power device-substrate assemblies 32 of the power electronics embedded PCB 20, and the bonding interface 120 can include a bonding layer in direct contact with the upper surface 42 of the cold plate 40. The bonding layer can be formed from any bonding material suitable for electronic circuitry and/or semiconductor component fabrication including tin, lead free solders, bonding material used for transient liquid phase (TLP) bonding, and bonding material used for sintering, among others. Also, the bonding layer can have a thickness between about 50 μm and about 250 μm, for example, between about 50 μm and about 200 μm, between about 50 μm and about 150 μm, or between about 75 μm and about 125 μm.

In some variations, a thin (e.g., less than about 10 or 20 μm) metallization that enhances bonding between the bonding interface 120 and the power electronics embedded PCB 20 and/or the cold plate 40 is included. For example, in some variations the bonding interface 120 includes the CVD dielectric layer, the LTR dielectric layer, or the ceramic sintered layer, and in such variations a thin metallization layer can be present between the upper surface 42 of the cold plate 40 and the CVD dielectric layer, the LTR dielectric layer, or the ceramic sintered layer, and/or a thin metallization layer can be present between the lower surface 22 of the power electronics embedded PCB 20 and the CVD dielectric layer, the LTR dielectric layer, or the ceramic sintered layer. However, it should be understood that when the bonding interface 120 does not include an electrical insulation layer, e.g., when a copper conductive layer of a multi-layer PCB is bonded directly to a cold plate, a metallization layer may not be desired or present.

Figure 3A:
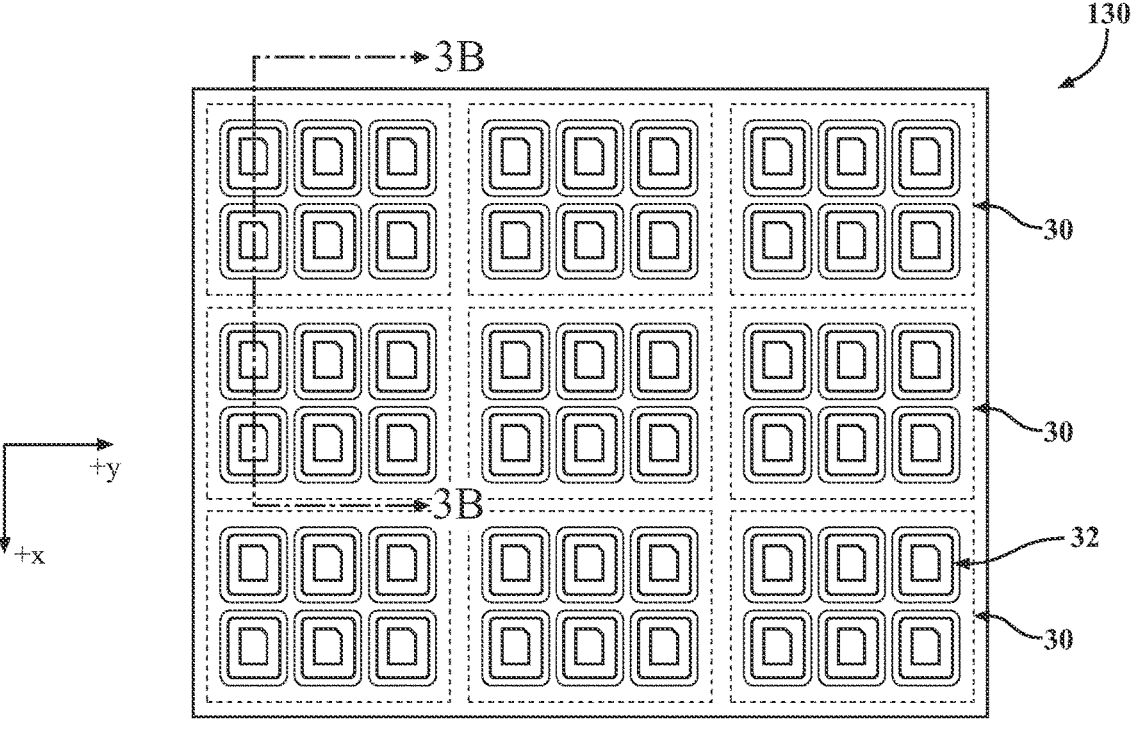
FIG. 3A shows a top view of a power device fabrication panel according to the teachings of the present disclosure.

Referring now to FIGS. 3A-3G, steps for manufacturing a plurality of highly integrated power electronics embedded PCB-cold plate assemblies 2 according to at least one form of the present disclosure are shown. For example, FIG. 3A illustrates preparing or providing a power device fabrication panel 130 from which nine (9) separate power device units 30 are formed. That is, the power device fabrication panel 130 is manufactured to have nine individual power device units 30 after the power device fabrication panel 130 is cut or separated into individual power device units as illustrated by the dotted lines in the figure. Also, each of the power device units 30 includes one or more power device-substrate assemblies 32 (six power device-substrate assemblies 32 per power device unit 30 shown in FIG. 3A). It should be understood that the power device fabrication panel 130 can be manufactured to have less than nine or more than nine individual power device units 30 after the power device fabrication panel 130 is cut or separated into individual power device units and each power device unit 30 can include less than six or more than six power device-substrate assemblies 32.

Figure 3B:
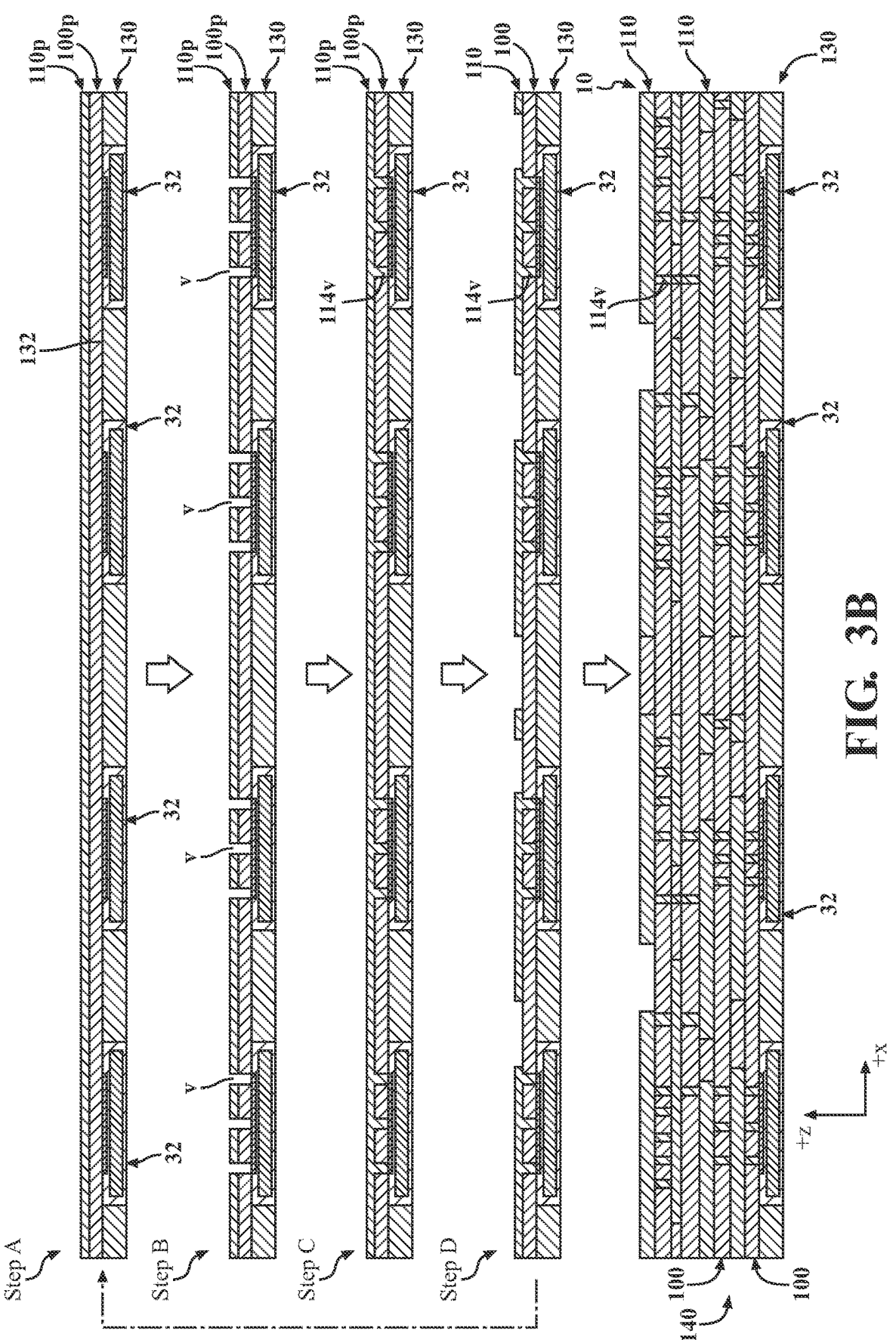
FIG. 3B illustrates bonding the power device fabrication panel in FIG. 3A to a multi-layer PCB and forming an IPEs embedded PCB fabrication panel according to the teachings of the present disclosure.

FIG. 3B illustrates bonding (e.g., laminating) a multi-layer PCB 10 to the power device fabrication panel 130 and forming an IPEs embedded PCB fabrication panel 140. In some variations, bonding the multi-layer PCB 10 to the power device fabrication panel 130 includes bonding or fabricating the multi-layer PCB 10 on the power device fabrication panel layer(s)-by-layer(s). For example, bonding of the multi-layer PCB 10 to the power device fabrication panel 10 can include bonding a dielectric layer 100$p$ (e.g., an FR4 layer) and a conductive layer 110$p$ to an upper (+z direction) surface 132 of the power device fabrication panel 130 as illustrated at Step A in FIG. 3B, and drilling vias 'v' into and at least partially through the dielectric layer 100$p$ and conductive layer 110$p$ at Step B. In at least one variation, the vias extend through the dielectric layer 100$p$, the conductive layer 110$p$, and to the power device-substrate assemblies 32. For example, the vias can extend through the dielectric layer 100$p$, the conductive layer 110$p$, and to a power device 33 (FIG. 2) of the power device-substrate assemblies 32. The vias v are filled with conductive material to form conductive vias 114$v$ at Step C and thereby provide interlayer conductive connection(s), and a portion or portions 'p' of the conductive layer 110$p$ can be removed at Step D to provide a desired or designed conductive pattern to provide a power layer 110. In addition, Steps A-D, and others (not shown), can be repeated until the multi-layer PCB 10 is formed and bonded to the power device fabrication panel 130 and the IPEs embedded PCB fabrication panel 140 is provided. In some variations, the vias are formed or drilled using laser drilling, the vias are filled with conductive material using electroplating (e.g., electroplating of copper into the vias v), and/or the portion(s) of the conductive layer 110$p$ is/are removed by etching (e.g., acid etching).

It should be understood that bonding the multi-layer PCB 10 to the power device fabrication panel 130 and forming the IPEs embedded PCB fabrication panel 140 before bonding the power device fabrication panel 130 to a cold plate substrate panel 200 (FIG. 3C) provides electrical communication or pathways between adjacent power layers 110 and the power device-substrate assemblies 32 without exposing the cold plate fabrication panel 200 made from a reactive metal such as aluminum to a corrosive electroplating solution. Stated differently, fabricating the IPEs embedded PCB fabrication panel 140 without the presence of the cold plate fabrication panel 200 protects the cold plate fabrication panel 200 from being in contact with and possibly corroded by an electroplating solution and/or electroplating process.

Figure 3C:
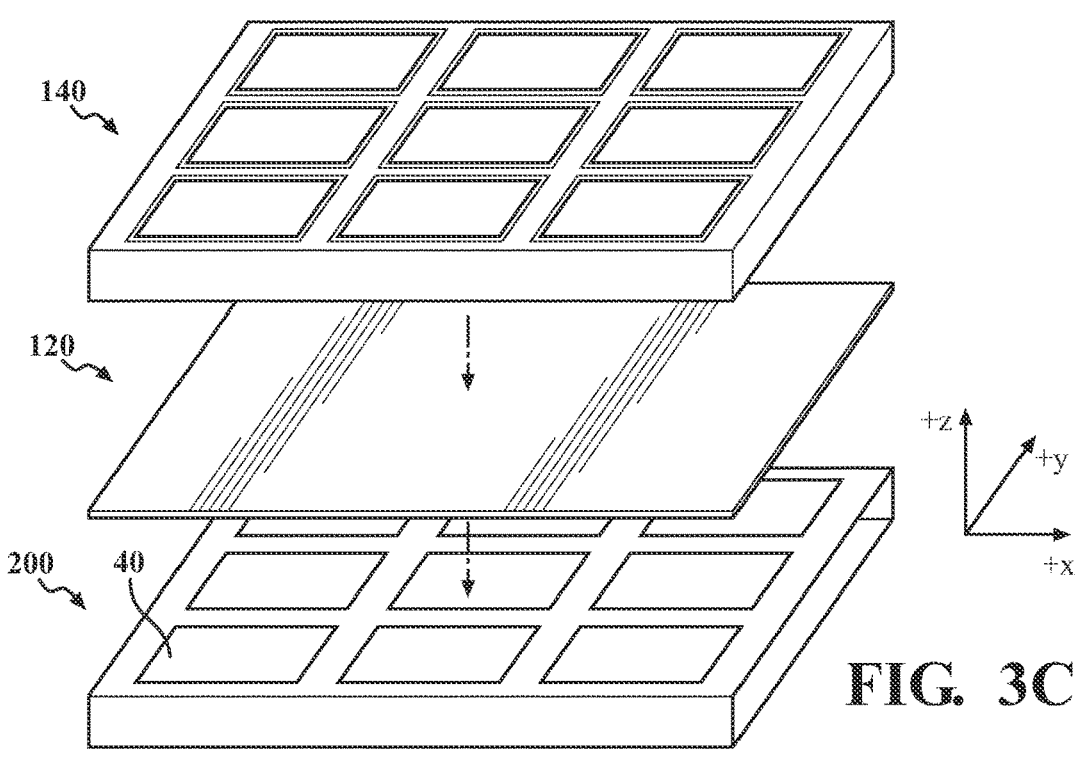
FIG. 3C illustrates the IPEs embedded PCB fabrication panel in FIG. 3B being bonded to a cold plate fabrication panel and forming an IPEs embedded PCB-cold plate fabrication panel according to the teachings of the present disclosure.
Figure 3D:
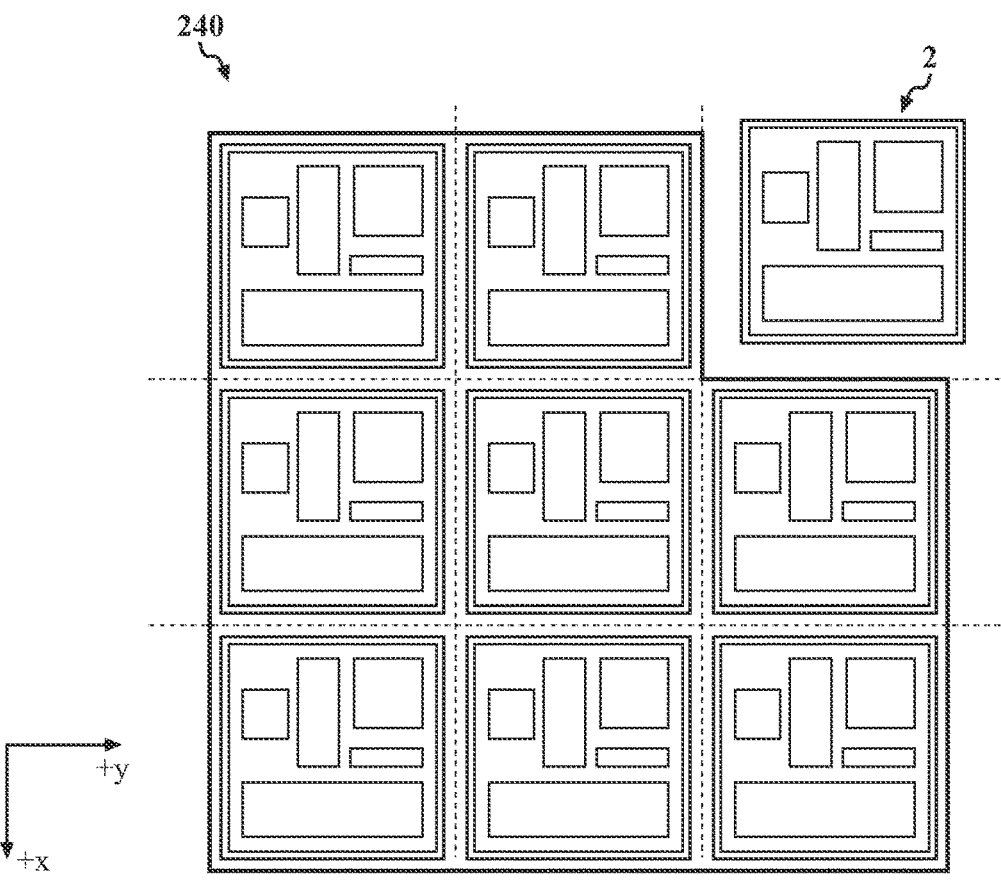
FIG. 3D illustrates cutting the IPEs embedded PCB-cold plate fabrication panel into a plurality of highly IPEs embedded PCB-cold plate assemblies according to the teachings of the present disclosure.

FIG. 3C illustrates bonding the IPEs embedded PCB fabrication panel 140 to the cold plate fabrication panel 200 to form an IPEs embedded PCB-cold plate fabrication panel 240 is formed (FIG. 3D). It should be understood that the power device-substrate assemblies 32 in the IPEs embedded PCB fabrication panel 140 are aligned with individual cold plates 40 of the cold plate fabrication panel 200 as shown below. The IPEs embedded PCB fabrication panel 140 can be bonded to the cold plate fabrication panel 200 using any bonding technique or process suitable for bonding a multi-layer PCB to a cold plate, including the techniques and processes disclosed herein. And as noted above, in some variations, the IPEs embedded PCB fabrication panel 140 is bonded to the cold plate fabrication panel 200 via a bonding interface 120 that includes a CVD dielectric layer, a LTR dielectric layer, or a ceramic sintered layer.

In some variations, the IPEs embedded PCB fabrication panel 140 is laminated to the cold plate fabrication panel 200 via the bonding interface 120, while in other variations IPEs embedded PCB fabrication panel 140 is bonded to the cold plate fabrication panel 200 via the bonding interface 120 using heat (i.e., elevated temperature) and/or pressure (i.e., elevated pressure). For example, in some variations pressures between about 2.1 megapascals (MPa) (300 pounds per square inch (psi)) and about 2.8 MPa (400 psi) are applied to the IPEs embedded PCB fabrication panel 140 and the cold plate fabrication panel 200 (with the bonding interface 120 sandwiched therebetween). In the alternative, or in addition to, the IPEs embedded PCB fabrication panel 140 and the cold plate fabrication panel 200, with the bonding interface 120 sandwiched therebetween, are held at temperatures between about 150° C. (300° F.) and about 204° C. (400° F.).

Figure 3E:
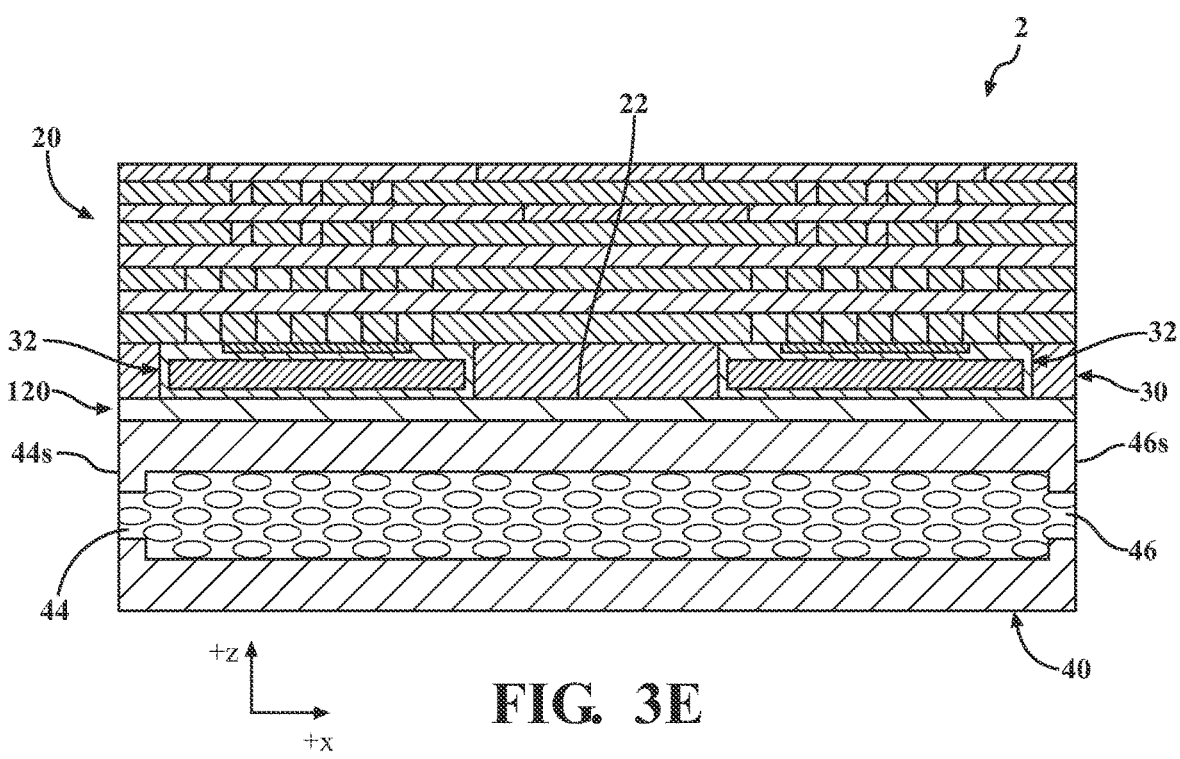
FIG. 3E shows a side cross-sectional view of one of the highly IPEs embedded PCB-cold plate assemblies in FIG. 3D with an inlet and an outlet formed in sidewalls of the cold plate according to the teachings of the present disclosure.
Figure 3F:
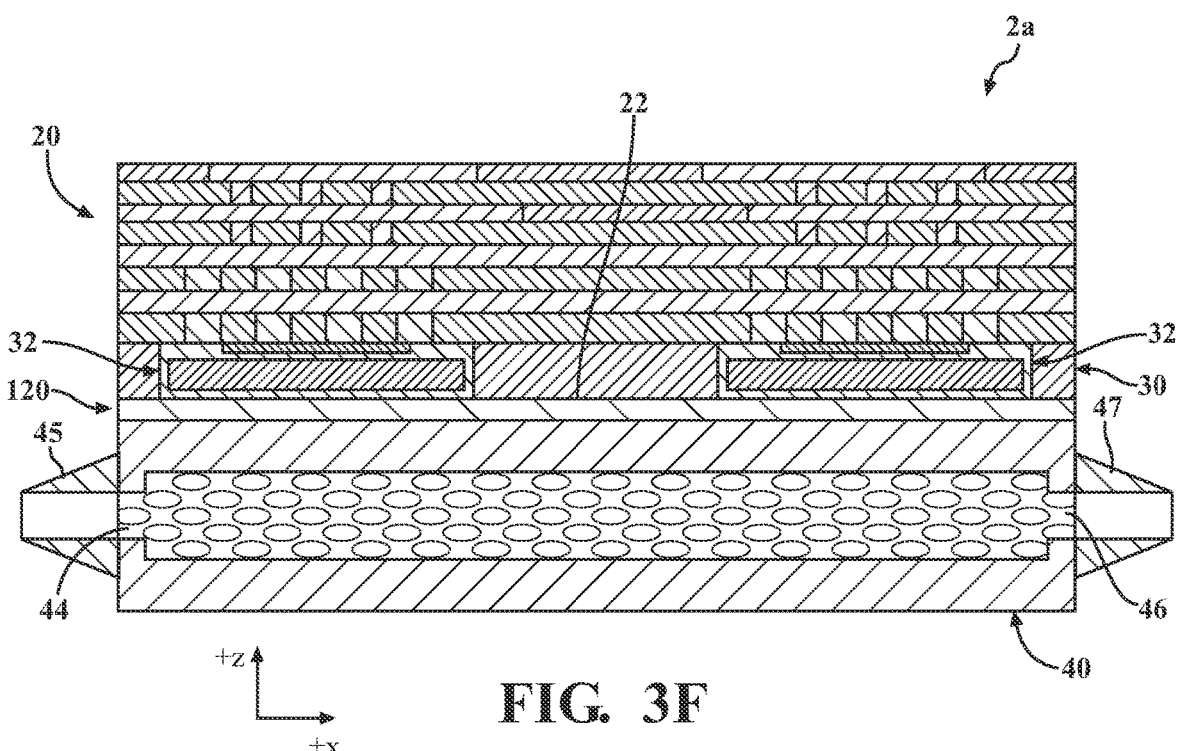
FIG. 3F shows a side cross-sectional view of the highly IPEs embedded PCB-cold plate assembly in FIG. 3E with an inlet tube and an outlet tube attached to the inlet and the outlet, respectively, according to the teachings of the present disclosure.
Figure 3G:
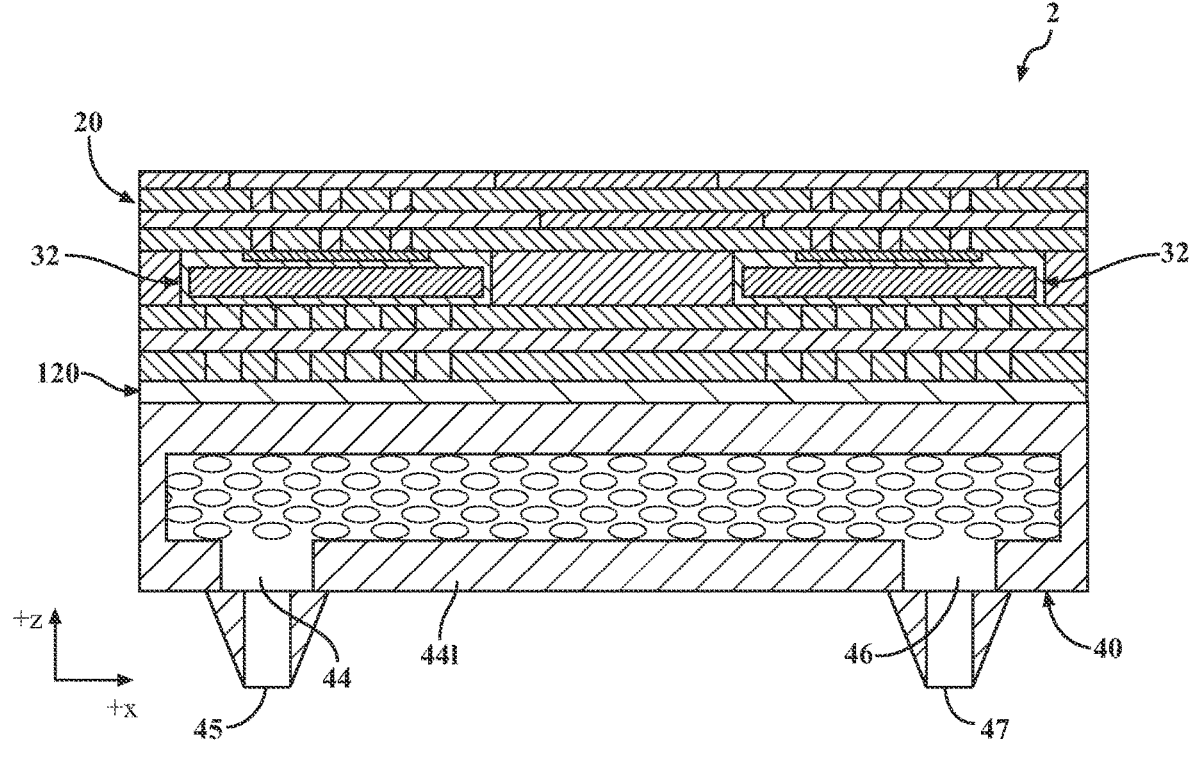
FIG. 3G shows a side cross-sectional view of one of the highly IPEs embedded PCB-cold plate assemblies in FIG. 3D with an inlet and an outlet formed in a lower wall of the cold plate, and an inlet tube and an outlet tube attached to the inlet and the outlet, respectively, according to the teachings of the present disclosure.

FIG. 3D illustrates the IPEs embedded PCB-cold plate fabrication panel 240 being cut into individual highly IPEs embedded PCB-cold plate assemblies 2 and FIG. 3E shows a cross-sectional side view of a highly IPEs embedded PCB-cold plate assembly 2. Particularly, the highly IPEs embedded PCB-cold plate assembly 2 includes two power device-substrate assemblies 32 along or aligned with a lower surface 22 of the IPEs embedded PCB 20. Also the inlet 44 and outlet 46 are formed on sidewalls 44$s$, 46$s$, respectively, of the cold plate 40, and the inlet tube 45 and the outlet tube 47 are attached to and in fluid communication with the inlet 44 and the outlet 46, respectively, as shown in FIG. 3F. And while FIGS. 3E-3F illustrate that the highly IPEs embedded PCB-cold plate assembly 2 with the inlet 44 and outlet 46 formed on sidewalls 44$s$, 46$s$, respectively, FIG. 3G shows a side cross-sectional view of a highly IPEs embedded PCB-cold plate assembly 2 with the inlet 44 and outlet 46 formed on a lower wall 441 of the cold plate 40. And in such variations, the inlet tube 45 and the outlet tube 47 are in fluid communication with the inlet 44 and the outlet 46, respectively, via attachment to the lower wall 441.

Figures 4A, 4B:
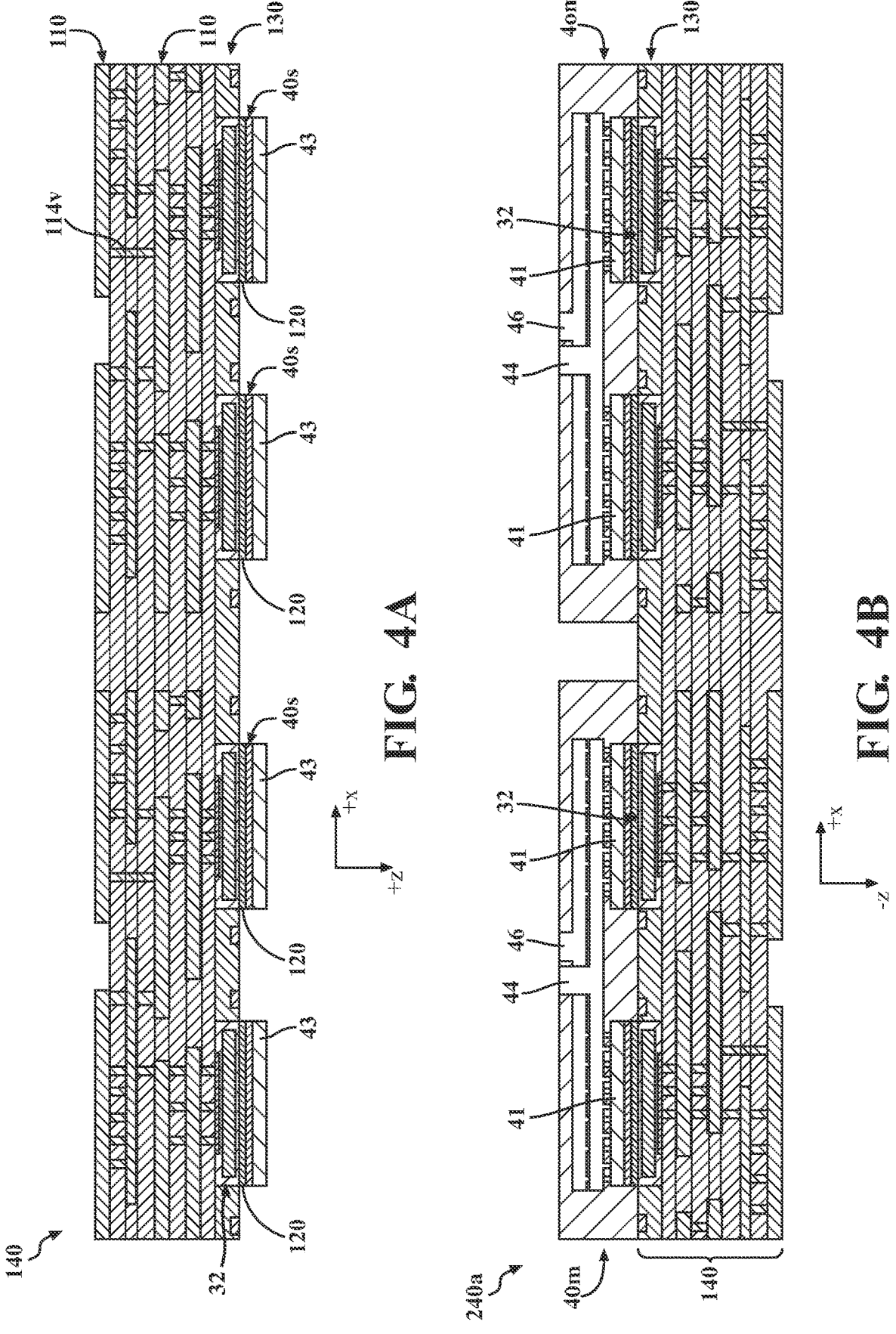
FIG. 4A shows a side view of a plurality of cold plate substrates bonded to the power devices of the IPEs embedded PCB fabrication panel in FIG. 3B.
FIG. 4B shows a side view of two cold plate manifolds bonded to the IPEs embedded PCB fabrication panel in FIG. 4A.

Referring now to FIGS. 4A-4D, steps for manufacturing a plurality of highly IPEs embedded PCB-cold plate assemblies 2a according to another form of the present disclosure are shown. Particularly, FIG. 4A illustrates bonding a plurality of cold plate substrates 40s onto the plurality of power device-substrate assemblies 32 of the IPEs embedded PCB fabrication panel 140. And FIG. 4B illustrates a plurality of cold plate manifolds 40m, with inlets 44 and outlets 46, bonded to the power device fabrication panel 130 such that a plurality of cold plates 40 are bonded to the IPEs embedded PCB fabrication panel 140 and an IPEs embedded PCB-cold plate fabrication panel 240a is formed or provided.

In some variations the plurality of cold plate substrates 40s are bonded to the plurality of power device-substrate assemblies 32 via the bonding interface 120 disclosed herein. Also, in some variations, fins, porous material, mesh-structured, machined or cast heat sinks 43 are bonded to or integral with the plurality of cold plate substrates 40s when the plurality of cold plate substrates 40s are bonded to the plurality of power device-substrate assemblies 32, while in other variations, the fins, porous material, mesh-structured, machined or cast heat sinks 43 are bonded to the plurality of cold plate substrates 40s after the plurality of cold plate substrates 40s are bonded to the plurality of power device-substrate assemblies 32.

In some variations, the plurality of cold plate manifolds 40m are polymer manifolds, and in at least one variation the plurality of cold plate manifolds 40m are 3D printed polymer manifolds. Also, the plurality of cold plate manifolds 40m are bonded to the power device layer 30 using any bonding or attachment technique suitable for providing a leak-tight bond or seal between the plurality of cold plate manifolds 40m and the power device layer 30. That is, the plurality of cold plate manifolds 40m are bonded to the power device layer 30 such that the fluid chambers 41 are leak tight, e.g., fluid enters the fluid chamber 41 only through the inlet 44 and exits the fluid chamber 41 only through the outlet 46. And in at least one variation, the plurality of cold plate manifolds 40m are bonded and sealed to the power device layer 30 using a flexible epoxy.

Figures 4C, 4D:
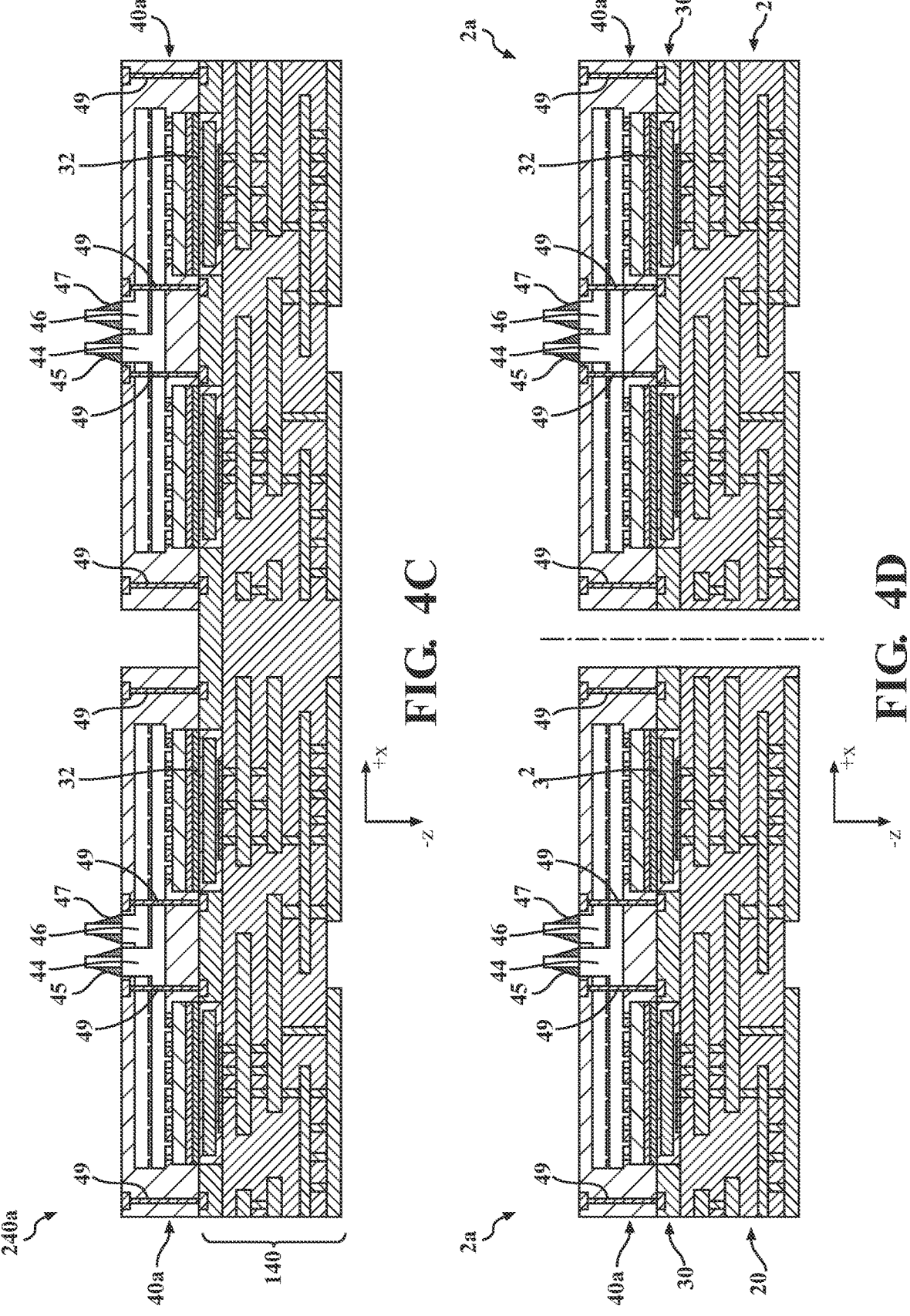
FIG. 4C shows a side view of a FIG. 4B after the two cold plate manifolds have been fastened (and reinforced) to the IPEs embedded PCB fabrication panel, and an inlet tube and an outlet tube have been bonded to each of the cold plate manifolds, such that an IPEs embedded PCB-cold plate fabrication panel is formed.
FIG. 4D illustrates cutting the IPEs embedded PCB-cold plate fabrication panel in FIG. 4C into a plurality of highly IPEs embedded PCB-cold plate assemblies.

Referring to FIG. 4C, in some variations, the plurality of cold plate manifolds 40m are further fastened to the power device layer 30 and/or reinforced with one or more mechanical fasteners 49, 4C. For example, the power device layer 30 can include one or more embedded lugs 31 such that the mechanical fasteners 49 engage the lugs and rigidly secure the cold plate manifolds 40m to the power device layer 30 and/or reinforce and provide strength to the cold plate manifolds 40m. An inlet tube 45 and an outlet tube 47 can be attached to and in fluid communication with the inlet 44 and outlet 46, respectively, and with reference to FIG. 4D, the IPEs embedded PCB-cold plate fabrication panel 240a is cut into individual highly integrated power electronics embedded PCB-cold plate assemblies 2a.

Figure 5:
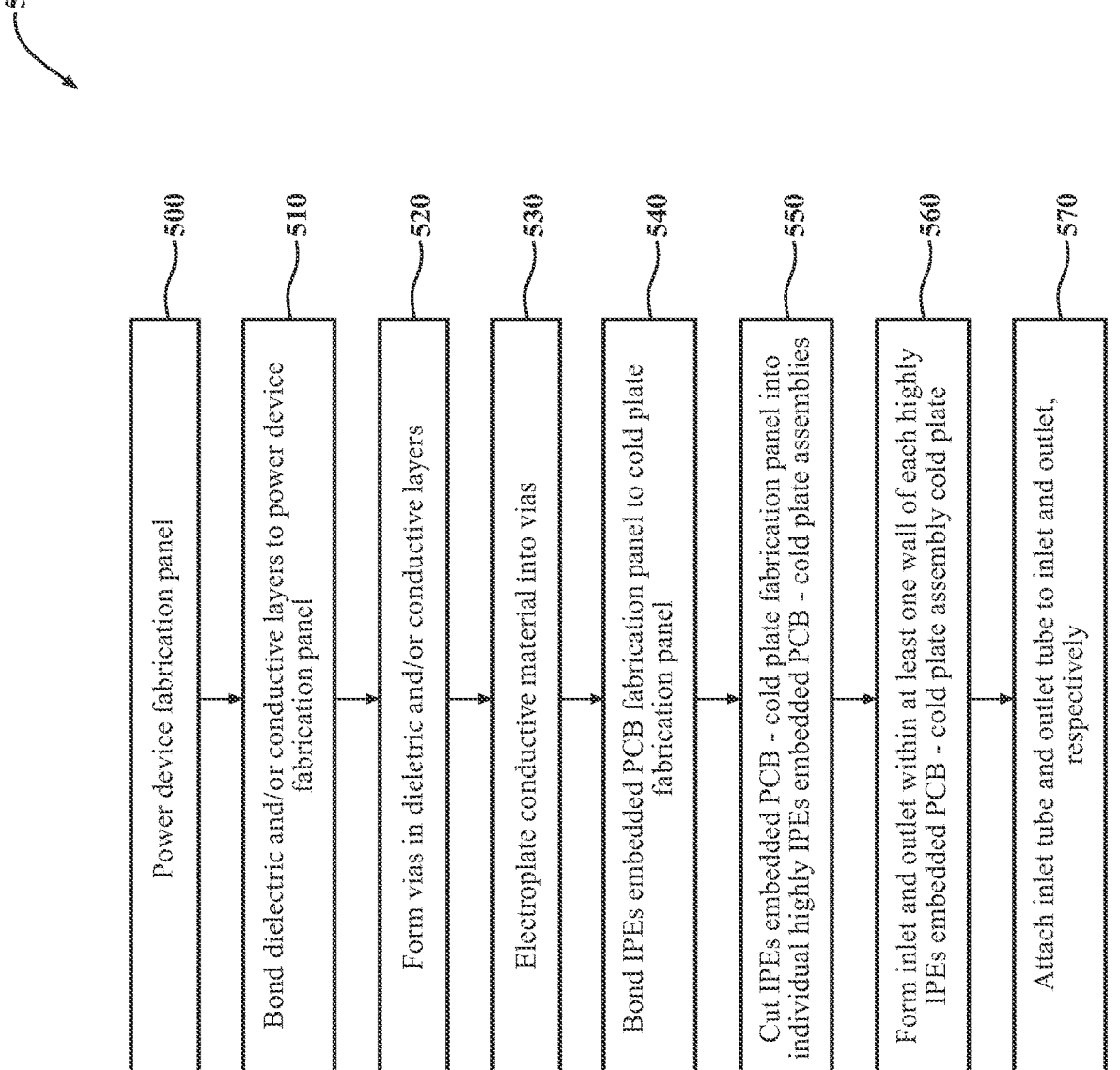
FIG. 5 is a flow chart for a method of manufacturing a plurality of highly IPEs embedded PCB-cold plate assemblies according to one form of the present disclosure.

Referring now to FIG. 5, a method 50 for manufacturing a plurality of highly IPEs embedded PCB-cold plate assemblies according to one form of the present disclosure includes preparing or providing a power device fabrication panel at 500 and bonding a pre-fab multi-layer PCB to the power device fabrication panel at 510. In some variations, the pre-fab multi-layer PCB is bonded to the power device fabrication panel via a CVD dielectric layer bonding interface. In other variations, the pre-fab multi-layer PCB is bonded to the power device fabrication panel via an LTR dielectric layer bonding interface. And in at least one variation, the pre-fab multi-layer PCB is bonded to the power device fabrication panel via a ceramic sintered layer.

At 520, the method 50 includes drilling and forming vias in the pre-fab multi-layer PCB at 520 and the pre-fab multi-layer PCB with vias is electroplated to form the conductive vias 114v therein at 530, and thereby form an IPEs embedded PCB fabrication panel. The IPEs embedded PCB fabrication panel is bonded to a cold plate fabrication panel to form an IPEs embedded PCB-cold plate fabrication panel at 540 and the IPEs embedded PCB-cold plate fabrication panel is cut into individual highly IPEs embedded PCB-cold plate assemblies at 550. In some variations, the IPEs embedded PCB fabrication panel is bonded to the cold plate fabrication panel via a CVD dielectric layer bonding interface. In other variations, the IPEs embedded PCB fabrication panel is bonded to the cold plate fabrication panel via a LTR dielectric layer bonding interface. And in at least one variation, the IPEs embedded PCB fabrication panel is bonded to the cold plate fabrication panel via a sintered ceramic layer bonding interface. And in some variations, an inlet and an outlet is formed within at least one wall of the cold plate of each highly IPEs embedded PCB-cold plate assembly at 560 and an inlet tube and an outlet tube are attached to the inlet and outlet, respectively, at 570.

Figure 6:
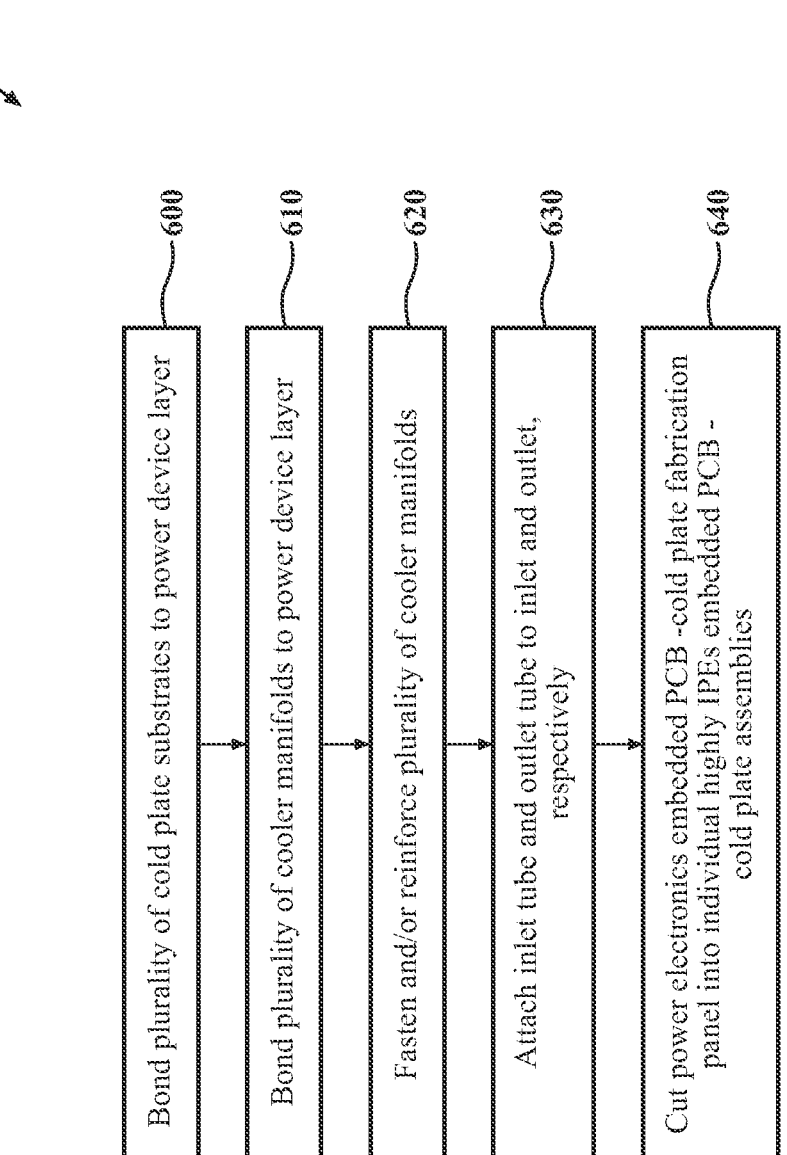
FIG. 6 is a flow chart for a method of manufacturing a plurality of highly IPEs embedded PCB-cold plate assemblies according to another form of the present disclosure.

Referring now to FIG. 6, a method 60 for manufacturing a plurality of highly IPEs embedded PCB-cold plate assemblies according to another form of the present disclosure includes bonding a plurality of cold plate substrates onto a power device layer having a plurality of power devices embedded therein at 600 and bonding a plurality of cold plate manifolds onto the power device layer at 610. In some variations, the plurality of cold plate substrates are bonded onto the power device layer via a CVD dielectric layer bonding interface, while in other variations the plurality of cold plate substrates are bonded onto the power device layer via a LTR dielectric layer bonding interface. And in at least one variation, the plurality of cold plate substrates are bonded onto the power device layer via a sintered ceramic layer bonding interface.

In some variations, fins, porous material, mesh-structured, machined or cast heat sinks are bonded to or integral with the plurality of cold plate substrates when the plurality of cold plate substrates are bonded to the power device layer, while in other variations, the fins, porous material, mesh-structured, machined or cast heat sinks are bonded to the plurality of cold plate substrates after the plurality of cold plate substrates are bonded to the power device layer.

Optionally, the plurality of cold plate manifolds are further fastened to the power device layer and/or reinforced with one or more mechanical fasteners at 620. Also, an inlet tube and an outlet tube are attached to and in fluid communication with an inlet and an outlet, respectively, of each cold plate manifold at 630 such that an IPEs embedded PCB-cold plate fabrication panel is formed. And at 640, the IPEs embedded PCB-cold plate fabrication panel is cut into individual highly IPEs embedded PCB-cold plate assemblies.

The preceding description is merely illustrative in nature and is in no way intended to limit the disclosure, its application, or its uses. Work of the presently named inventors, to the extent it may be described in the background section, as well as aspects of the description that may not otherwise qualify as prior art at the time of filing, are neither expressly nor impliedly admitted as prior art against the present technology.

The block diagram in the figures illustrates the functionality and operation of possible implementations of methods and systems according to various forms or variations. In this regard, each block in the block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for the general organization of topics within the present disclosure and are not intended to limit the disclosure of the technology or any aspect thereof. The recitation of multiple variations or forms having stated features is not intended to exclude other variations or forms having additional features, or other variations or forms incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should also be understood that the various method steps discussed herein do not have to be conducted in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A method comprising:
bonding a power device fabrication panel to a multi-layer printed circuit board (PCB);
drilling via passageways in the multi-layer PCB;
electroplating a conductive metal into the via passageway;
bonding a plurality of cold plates to the power device fabrication panel and forming an integrated power electronics (IPEs) embedded PCB-cold plate fabrication panel; and
cutting the IPEs embedded PCB-cold plate fabrication panel into a plurality of highly IPEs embedded PCB-cold plate assemblies that individually include an IPEs embedded PCB attached to and in thermal communication with a cold plate comprising a fluid chamber having at least one of an inlet and an outlet formed in a lower wall of the cold plate.

2. The method according to claim 1, wherein bonding the power device fabrication panel to the multi-layer PCB comprises laminating the multi-layer PCB onto the power device fabrication panel via a low thermal resistance dielectric layer.

3. The method according to claim 1, wherein drilling the via passageways comprises laser drilling the via passageways.

4. The method according to claim 1, wherein a bonding interface is disposed between the multi-layer PCB bonded to the cold plate fabrication panel, the bonding interface selected from the group consisting of a low thermal resistance dielectric layer bonding interface, a CVD dielectric layer bonding interface, solder-AlN-solder layers, solder-$Si_3N_4$-solder layers, a solder layer, and a polymer-conductive filler bonding interface.

5. The method according to claim 4, wherein the bonding interface further comprises a metallization layer.

6. The method according to claim 1, wherein at least one of a porous material and a plurality of fins is disposed within the fluid chamber of the cold plate.

7. The method according to claim 1 further comprising attaching at least one of an inlet tube and an outlet tube to the at least one of the inlet and the outlet formed in the lower wall of the cold plate.

8. The method according to claim 1, wherein bonding the multi-layer PCB to a plurality of cold plates and forming an integrated power electronics (IPEs) embedded PCB-cold plate fabrication panel comprises bonding a plurality of cold plate substrates directly to a plurality of power devices embedded in the power device fabrication panel.

9. The method according to claim 8 further comprising 3D printing a plurality of cold plate manifolds and bonding the plurality of cold plate manifolds onto the power device fabrication panel and forming the plurality of cold plates bonded to the multi-layer PCB.

10. A method comprising:

laminating a multi-layer printed circuit board (PCB) onto a power device fabrication panel via a low thermal resistance dielectric layer;

drilling via passageways in the multi-layer PCB;

electroplating copper into the via passageways;

bonding the multi-layer PCB to a cold plate fabrication panel and forming an integrated power electronics (IPEs) embedded PCB-cold plate fabrication panel; and cutting the IPEs embedded PCB-cold plate fabrication panel into a plurality of highly IPEs embedded PCB-cold plate assemblies that individually include an IPEs embedded PCB attached to and in thermal communication with a cold plate comprising a fluid chamber having at least one of an inlet and an outlet formed in a lower wall of the cold plate.

11. The method according to claim 10 further comprising forming the inlet and the outlet in the cold plate of each of the plurality of highly IPEs embedded PCB-cold plate assemblies, wherein the inlet is configured for a cooling fluid to flow into the fluid chamber of the cold plate and the outlet is configured for the cooling fluid to flow out of the fluid chamber.

12. The method according to claim 11 further comprising attaching an inlet tube and an outlet tube to the inlet and the outlet, respectively.

13. A method comprising:

laminating a multi-layer printed circuit board (PCB) onto a power device fabrication panel via a low thermal resistance dielectric layer;

drilling via passageways in the multi-layer PCB;

electroplating copper into the via passageways;

bonding a plurality of cold plate substrates directly to a plurality of a power devices embedded in the power device fabrication panel;

bonding a plurality of 3D printed cold plate manifolds to the power device fabrication panel and forming an integrated power electronics (IPEs) embedded PCB-cold plate fabrication panel; and cutting the IPEs embedded PCB-cold plate fabrication panel into a plurality of highly IPEs embedded PCB-cold plate assemblies that individually include an IPEs embedded PCB attached to and in thermal communication with a fluid chamber of a cold plate manifold comprising and at least one of an inlet and an outlet formed in a lower wall thereof.

14. The method according to claim 13 further comprising attaching at least one of an inlet tube and an outlet tube to the inlet and the outlet, respectively, of each of the plurality of 3D printed cold plate manifolds.

15. The method according to claim 10, wherein a bonding interface is disposed between the multi-layer PCB bonded to the cold plate fabrication panel, the bonding interface selected from the group consisting of a low thermal resistance dielectric layer bonding interface, a CVD dielectric layer bonding interface, solder-AlN-solder layers, solder-$Si_3N_4$-solder layers, a solder layer, and a polymer-conductive filler bonding interface.

16. The method according to claim 15, wherein the bonding interface further comprises a metallization layer.

17. The method according to claim 10, wherein at least one of a porous material and a plurality of fins is disposed within the fluid chamber of the cold plate.

18. The method according to claim 10, wherein bonding the multi-layer PCB to a cold plate fabrication panel and forming an integrated power electronics (IPEs) embedded PCB-cold plate fabrication panel comprises bonding a plurality of cold plate substrates directly to a plurality of power devices embedded in the power device fabrication panel.

19. The method according to claim 13, wherein drilling the via passageways comprises laser drilling the via passageways.

20. The method according to claim 13, wherein at least one of a porous material and a plurality of fins is disposed within the fluid chamber of the cold plate manifold.

* * * * *